US007862944B2

United States Patent
Hinz et al.

(10) Patent No.: US 7,862,944 B2
(45) Date of Patent: Jan. 4, 2011

(54) METHOD FOR DETECTION AND DIAGNOSIS OF ISOLATION FAULTS IN FUEL CELL HYBRID VEHICLES

(75) Inventors: Hartmut Hinz, Kronberg (DE); Steffen Doenitz, Darmstadt (DE)

(73) Assignee: GM Global Technology Operations, Inc., Detroit, MI (US)

( * ) Notice: Subject to any disclaimer, the term of this patent is extended or adjusted under 35 U.S.C. 154(b) by 1568 days.

(21) Appl. No.: 11/180,892

(22) Filed: Jul. 13, 2005

(65) Prior Publication Data
US 2007/0013382 A1    Jan. 18, 2007

(51) Int. Cl.
G01R 31/00    (2006.01)
H01M 16/00   (2006.01)

(52) U.S. Cl. .................. 429/430; 429/431; 429/432; 324/500

(58) Field of Classification Search ............... 324/500; 429/9
See application file for complete search history.

(56) References Cited

U.S. PATENT DOCUMENTS 6,731,116 B2 *   5/2004  Yamamoto et al. ........... 324/522
6,998,819 B2 *   2/2006  Jin .............................. 320/136
2001/0048605 A1 * 12/2001 Kurokami et al. ........ 363/56.03
2003/0137193 A1 *  7/2003 Belschner et al. ........... 307/9.1
2003/0155928 A1 *  8/2003 Roden et al. ................ 324/509
2004/0157091 A1 *  8/2004 Dewey et al. ................ 429/12
2004/0189330 A1 *  9/2004 Herb et al. .................. 324/691
2005/0048335 A1 *  3/2005 Fields et al. .................. 429/22
2006/0035115 A1 *  2/2006 Norimatsu et al. ............ 429/9

* cited by examiner

Primary Examiner—Patrick Ryan
Assistant Examiner—Stephen Yanchuk
(74) Attorney, Agent, or Firm—John A. Miller; Miller IP Group, PLC

(57) ABSTRACT

An isolation fault detection system for detecting isolation faults in a fuel cell system associated with a fuel cell hybrid vehicle. The isolation fault detection system measures a stack voltage potential, a positive fuel cell voltage potential, a negative fuel cell voltage potential, a positive battery voltage potential, and an overall battery voltage potential. The isolation fault detection system then uses these voltage potentials in mesh equations to compare the measured voltage potentials to voltage potentials that would occur during a loss of isolation. In one embodiment, the isolation fault detection system uses these five measured voltage potentials to determine whether an isolation fault has occurred at four separate locations in the fuel cell hybrid vehicle. The system also can detect the location of the isolation fault.

20 Claims, 1 Drawing Sheet

METHOD FOR DETECTION AND DIAGNOSIS OF ISOLATION FAULTS IN FUEL CELL HYBRID VEHICLES

BACKGROUND OF THE INVENTION

1. Field of the Invention

This invention relates generally to a system and method for providing high voltage isolation fault detection in a fuel cell hybrid vehicle and, more particularly, to an isolation fault detection system for providing high voltage isolation fault detection in a fuel cell hybrid vehicle, where various voltage potentials are measured and compared with voltage potentials that would occur during an isolation fault to detect the isolation fault.

2. Discussion of the Related Art

Hydrogen is a very attractive fuel because it is clean and can be used to efficiently produce electricity in a fuel cell. The automotive industry expends significant resources in the development of hydrogen fuel cells as a source of power for vehicles. Such vehicles generate zero emissions and would be more efficient than today's vehicles employing internal combustion engines.

A hydrogen fuel cell is an electrochemical device that includes an anode and a cathode with an electrolyte therebetween. The anode receives hydrogen gas and the cathode receives oxygen or air. The hydrogen gas is dissociated in the anode to generate free hydrogen protons and electrons. The hydrogen protons pass through the electrolyte to the cathode. The hydrogen protons react with the oxygen and the electrons in the cathode to generate water. The electrons from the anode cannot pass through the electrolyte, and thus are directed through a load to perform work before being sent to the cathode. The work acts to operate the vehicle. A plurality of fuel cells are typically combined in a fuel cell stack to generate the desired output power.

A fuel cell hybrid vehicle includes a fuel cell stack and a secondary power source, such as a battery, where the stack is electrically connected to a fuel cell power bus supply that feeds the electrical drive train of the vehicle and other vehicle systems with electrical power. The output of the battery is connected to a battery power bus, which is electrically coupled to the fuel cell power bus through a DC/DC converter.

In order to provide safe operation of the fuel cell hybrid vehicle, all high voltage parts of the electrical system of the vehicle are electrically isolated from the vehicle chassis. However, various operating conditions of the vehicle may cause a high voltage part of the electrical system to be directly coupled to the vehicle chassis during vehicle operation. For example, the cooling fluid flowing through cooling channels in the stack initially has a low conductivity. However, as time goes by, the cooling fluid becomes contaminated and more conductive, which could cause an impermissible current flow to the vehicle chassis. Additionally, the isolation resistance between the power bus and the vehicle chassis of any component can be reduced by a fault, for example mechanical damage, water inside the component, etc. In the worst case, a short circuit can occur. In the case of a fault, accessible live parts of the power bus from, for example, damaged cable insulation, unplugged connectors, removed converter covers, etc., can create a hazardous current flow through a human body.

The loss of high voltage isolation between a high voltage part of the vehicle electrical system and the vehicle chassis must therefore be detectable during vehicle operation to provide the desired safety. Conventional isolation fault detection devices cannot effectively be used in fuel cell hybrid vehicles because the isolation resistances in the fuel cell stack are asymmetrical. Particularly, because of the stack design and geometry, including the flow of the cooling fluid through the stack, the voltage potential between a positive terminal of the stack and the vehicle chassis ground is different than the voltage potential between the negative terminal of the stack and the chassis ground. Thus, conventional isolation fault detection systems that rely on an imbalance between voltage potentials to indicate the fault cannot be used in a fuel cell system.

When an isolation fault is detected, the isolation fault detection system will take suitable action, such as shutting down the system or providing a warning light to the vehicle operator. Additionally, it is desirable that the isolation fault detection system identify the location of the isolation fault so that it can be readily corrected.

SUMMARY OF THE INVENTION

In accordance with the teachings of the present invention, an isolation fault detection system is disclosed for detecting isolation faults in a fuel cell system associated with a fuel cell hybrid vehicle. A plurality of isolation resistances are defined in the fuel cell system. The isolation fault detection system measures a stack voltage potential, a positive fuel cell voltage potential, a negative fuel cell voltage potential, a positive battery voltage potential, and an overall battery voltage potential. The isolation fault detection system then uses these voltage potentials in mesh equations to compare the measured voltage potentials to voltage potentials that would occur during a loss of isolation at the isolation resistances. In one embodiment, the isolation fault detection system uses these five measured voltage potentials to determine whether an isolation fault has occurred at four separate isolation resistance locations in the fuel cell hybrid vehicle. The system also can detect the location of the isolation fault.

Additional features of the present invention will become apparent from the following description and appended claims, taken in conjunction with the accompanying drawings.

DETAILED DESCRIPTION OF THE EMBODIMENTS

Figure 1:
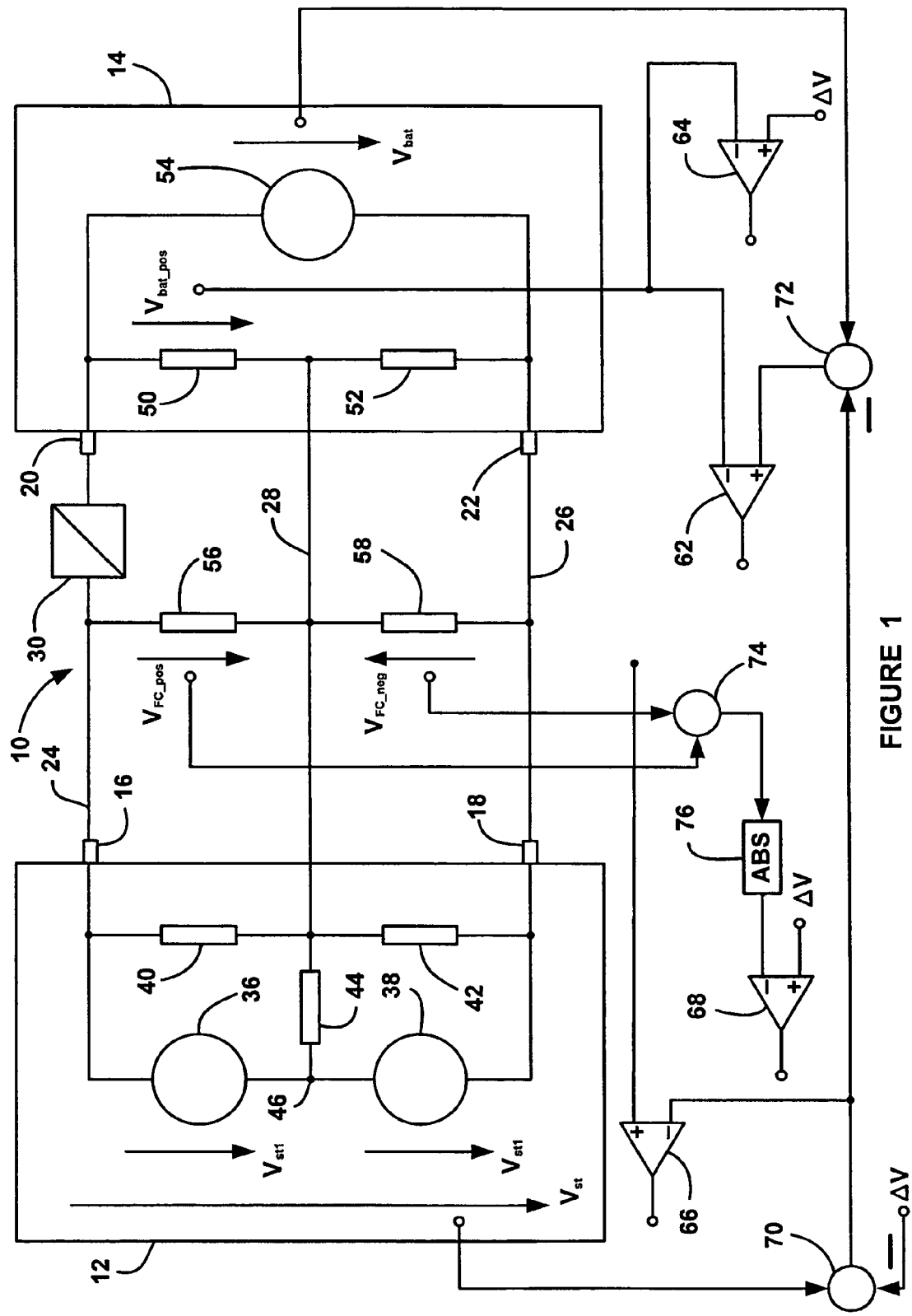
FIG. 1 is a schematic diagram of an isolation fault detection system for a fuel cell hybrid vehicle, according to an embodiment of the present invention.

The following discussion of the embodiments of the invention directed to an isolation fault detection system for a fuel cell system is merely exemplary in nature, and is in no way intended to limit the invention or its applications or uses. For example, the isolation fault detection system of the invention has particular application for a fuel cell hybrid vehicle. However, as will be appreciated by those skilled in the art, the isolation fault detection system of the invention may have use for other applications.

FIG. 1 is a schematic diagram of an isolation fault detection system 10 for a fuel cell system associated with a fuel cell hybrid vehicle. The system 10 includes an equivalent circuit of various electrical components of the fuel cell system. The system 10 includes a fuel cell stack 12 and a secondary battery 14. The fuel cell stack 12 includes a positive stack terminal 16 and a negative stack terminal 18, and the battery 14 includes a positive battery terminal 20 and a negative battery terminal 22. A positive electrical rail 24 is electrically coupled to the positive terminals 16 and 20, and a negative electrical rail 26 is electrically coupled to the negative terminals 18 and 22, where the rails 24 and 26 represent the system power bus. An electrical rail 28 represents vehicle chassis ground. A DC/DC converter 30 is provided in the positive rail 24 to decouple the stack power bus from the battery power bus.

The voltage of the stack 12 is defined by a voltage potential $V_{st1}$, represented by a voltage source 36, between the positive stack terminal 16 and an internal stack terminal 46, and a voltage potential $V_{st2}$, represented by a voltage source 38, between the negative stack terminal 18 and the internal stack terminal 47, where the stack voltage is $V_{st}=V_{st1}+V_{st2}$. The battery voltage $V_{bat}$ is represented by a source 54, and a positive battery potential $V_{bat\_pos}$ is defined between the positive battery terminal 20 and the ground rail 28. The battery potential between the positive battery terminal 20 and the ground rail 28 and the negative battery terminal 22 and the ground rail 28 would be the same when the battery is disconnected from the positive rail 24 and the negative rail 26. However, during operation of the system 10, the asymmetry of the stack potentials also causes the battery potentials to be different. All of the loads of the system 10, including the vehicle drive, the compressor drive, heating systems, etc., are electrically connected in parallel to the positive rail 24 and the negative rail 26.

As will be discussed below, the equivalent circuit of the system 10 defines seven isolation resistances that isolate the high voltage parts of the electrical system from the chassis ground. If any of these isolation resistances falls below a predetermined minimum resistance, then a loss of high voltage isolation has occurred that presents a safety issue.

The liquid coolant flowing through the coolant flow channels in the stack 12 in combination with the stack geometry determines the isolation resistances of the electrical parts of the stack 12 relative to the vehicle chassis ground. The stack 12 includes three isolation resistances that define the electrical isolation of the stack 12 from the vehicle chassis. These isolation resistances include an isolation resistance $R_{st1}$ 40 between the positive stack terminal 16 and the ground rail 28, an isolation resistance $R_{st2}$ 42 between the negative stack terminal 18 and the ground rail 28 and an isolation resistance $R_{st0}$ 44 between an internal stack terminal 46 and the ground rail 28. The isolation resistance 44 represents an internal resistance of the stack 12, such as between individual plates in the stack 12. The asymmetry of the stack 12, as discussed above, is determined by the ratio of the resistances 40, 42 and 44.

The battery 14 includes an isolation resistance $R_{bat\_pos}$ 50 between the positive battery terminal 20 and the ground rail 28 and an isolation resistance $R_{bat\_neg}$ 52 between the negative battery terminal 22 and the ground rail 28. The combination of all of the stack loads defines a positive fuel cell isolation resistance $R_{FC\_pos}$ 56 between the positive rail 24 and the ground rail 28 and a negative fuel cell isolation resistance $R_{FC\_neg}$ 58 between the negative rail 26 and the ground rail 28. The isolation resistance 56 defines a positive fuel cell potential $V_{FC\_pos}$ and the isolation resistance 58 defines a negative fuel cell potential stack $V_{FC\_neg}$.

According to the invention, the isolation fault detection system 10 monitors the voltage potential across the isolation resistances 40, 42, 46, 50, 52, 56 and 58 so that if any of the resistances falls below a predetermined minimum resistance, an isolation fault is detected. If one or more of the isolation resistances 40, 42, 44, 50, 52, 56 and 58 falls below the minimum resistance during operation of the vehicle, a warning is sent to the vehicle controller (not shown) and the driver.

As will be discussed in more detail below, the isolation fault detection is provided based on the isolation resistances 40, 42, 44, 50, 52, 56 and 58 by measuring the positive and negative voltage potentials of the rails 24 and 26 with respect to the vehicle chassis, the positive battery terminal voltage potential with respect to the vehicle chassis, the stack voltage potential and the overall battery voltage potential. These measured voltage potentials are compared with voltage potentials that would occur in the case of a loss of isolation to detect the isolation faults. Further, by knowing which measured voltage potential produced the isolation fault, the location of the fault can be determined by the system.

The equivalent circuit discussed above in the system 10 shows that an isolation fault can occur at four locations in the system 10 where the particular voltage potential increases. First, an isolation fault occurs between the positive stack terminal 16 and the ground rail 28 if one of the isolation resistances 56 or 40 falls below a predetermined minimum resistance. Second, an isolation fault occurs between the positive battery terminal 20 and the ground rail 28 if the isolation resistance 50 falls below a predetermined minimum resistance. Third, an isolation fault occurs between the negative stack terminal 18 or the negative battery terminal 22 and the ground rail 28 if one of the isolation resistances 42, 58 or 52 falls below a predetermined minimum resistance. Fourth, an isolation fault occurs between the internal stack terminal 46 and the ground rail 28 if the isolation resistance 44 falls below a predetermined minimum resistance.

To determine if an isolation fault has occurred for the first case, the voltage potential between the positive battery terminal 20 and the ground rail 28 is defined by a mesh equation $V_{bat\_pos}=V_{bat}-(V_{st1}+V_{st2})$ that would be satisfied if an isolation fault has occurred at the isolation resistance 56 or 40. Particularly, if either of the isolation resistances 40 or 56 goes to zero, then $V_{bat\_pos}$ is equal to $V_{bat}-V_{st}$. This is a worst-case scenario where the isolation resistance 40 or 56 has gone all the way to zero. In practice, an isolation fault will occur if the isolation resistance falls below a certain minimum resistance.

To determine if an isolation fault has occurred for the second case, the potential between the positive battery terminal 20 and the ground rail 28 is defined by a mesh equation $V_{bat\_pos}=0$ that would occur during an isolation fault at the isolation resistance 50. Therefore, if the potential $V_{bat\_pos}$ is zero, then the resistance 50 is zero, and an isolation fault has occurred at the isolation resistance 50.

To determine if an isolation fault has occurred for the third case, the potential between the positive stack terminal 16 and the ground rail 28 is defined by a mesh equation $V_{FC\_pos}=(V_{st1}+V_{st2})$. Therefore, if any of the isolation resistances 42, 52 or 58 goes to zero, then this equation is satisfied, and an isolation fault has occurred at one of these locations.

To determine if an isolation fault has occurred for the fourth case, the potential between the positive stack terminal 16 and the ground rail 28 is defined by the mesh equation $V_{FC\_pos}=V_{st1}$, and the potential between the negative stack terminal 18 and the ground rail 28 is defined by the mesh equation $V_{FC\_neg}=-V_{st2}$.

The principals of the isolation fault detection of the invention discussed above are shown in table 1.

TABLE 1

| Location of isolation fault | Monitored voltage potentials: Borderline case; $R_{iso} \to 0$ | Monitored voltage potentials: Practical realization |
| --- | --- | --- |
| Positive rail to ground fuel cell side bus (case 1) | $V_{bat\_pos} \to V_{bat} - (V_{st1} + V_{st2})$ | $V_{bat\_pos} < V_{bat} - (V_{st1} + V_{st2}) + \Delta V$ |
| Positive rail to ground battery side bus (case 2) | $V_{bat\_pos} \to 0$ | $V_{bat\_pos} < \Delta V$ |
| Negative rail to ground fuel cell side bus or negative rail to ground battery side bus (case 3) | $V_{FC\_pos} \to (V_{st1} + V_{st2})$ | $V_{FC\_pos} > (V_{st1} + V_{st2}) - \Delta V$ |
| Stack internal (case 4) | $V_{FC\_pos} \to V_{st1}$<br>$V_{FC\_neg} \to -V_{st2}$ | $abs(V_{FC\_pos} + V_{FC\_neg}) < \Delta V$ |

In Table 1, the first column lists the four locations of possible isolation faults, and the second column shows the voltage potentials for a complete loss of isolation at the corresponding location where the particular isolation resistance goes to zero, $R_{iso} \to 0$. In a real application, an isolation fault may occur that presents a safety problem without the particular isolation resistance 40, 42, 44, 50, 52, 56 and 58 going completely to zero. Therefore, the control system will provide minimum values for the isolation resistances 40, 42, 44, 50, 52, 56 and 58 where an isolation fault will be identified.

Each of the mesh equations discussed above, identified in column 2 of the Table 1, is revised to include a threshold voltage $\Delta V$ for real applications. Particularly, the third column shows the particular mesh equations for the practical realization of the voltage potential monitoring of the invention. The threshold voltage $\Delta V$ can be adjusted for a particular system to achieve an arbitrary sensitivity of the isolation fault of detection.

Because of the fact that the monitored voltage potentials are DC voltages, the measured signals can be filtered with a low pass filter having a small cut off frequency so that the isolation fault detection technique of the invention is unsusceptible to noise on the power supply bus generated by the propulsion inverters. The isolation fault detection method of the invention insures a safe operation of the system 10 in the event of an isolation fault and provides a diagnostic tool for fast debugging.

The isolation fault detection system 10 includes various components for detecting the isolation faults in the manner discussed above. Particularly, an output of a comparator 62 provides isolation fault detection for the first case, an output of a comparator 64 provides isolation fault detection for the second case, an output of a comparator 66 provides isolation fault detection for the third case, and an output of a comparator 68 provides isolation fault detection for the fourth case. If any of the outputs of the comparators 62, 64, 66 and 68 goes high, then an isolation fault has occurred at that location.

For the first case, the positive battery voltage potential $V_{bat\_pos}$ is applied to the negative terminal of the comparator 62. Additionally, the stack voltage potential $V_{st}$ and the predetermined threshold voltage $\Delta V$ are subtracted in a subtractor 70. The output of the subtractor 70 and the battery voltage potential $V_{bat}$ are subtracted in a subtractor 72. The output of the subtractor 72 is applied to the positive terminal of the comparator 62 to be compared with the voltage potential $V_{bat\_pos}$ as defined by the mesh equation for the first case discussed above. Therefore, if the voltage potential $V_{bat\_pos}$ falls below the value identified in the mesh equation, then an isolation fault has occurred at the isolation resistance 40 or 56.

For the second case, the battery voltage potential $V_{bat\_pos}$ is applied to the negative terminal of the comparator 64 and a predetermined threshold voltage $\Delta V$ is applied to the positive terminal of the comparator 64. Therefore, if the battery voltage potential $V_{bat\_pos}$ falls below the threshold voltage $\Delta V$, then the output of the comparator 64 will go high indicating an isolation fault at the isolation resistance 50.

For the third case, the output of the subtractor 70 is applied to the negative terminal of the comparator 66 and the positive fuel cell potential $V_{FC\_pos}$ is applied to the positive terminal of the comparator 66. Therefore, if the positive fuel cell potential $V_{FC\_pos}$ becomes greater than the stack voltage potential $V_{st}$ minus the threshold voltage $\Delta V$, then an isolation fault has occurred at one of the isolation resistances 42, 52 or 58.

For the fourth case, the negative fuel cell voltage potential $V_{FC\_neg}$ and the positive fuel cell voltage potential $V_{FC\_pos}$ are added in a summer 74. The output of the summer 74 is applied to an absolute value device 76 to generate the absolute value of the summation of the fuel cell voltage potentials. The output of the absolute value device 76 is applied to the negative terminal of the comparator 68 and a predetermined threshold voltage $\Delta V$ is applied to the positive terminal of the comparator 68. Therefore, if the absolute value of the sum of the positive fuel cell potential $V_{FC\_pos}$ and the negative fuel cell potential $V_{FC\_neg}$ falls below the threshold voltage $\Delta V$, then an isolation fault has occurred at the isolation resistance 44.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A system for detecting isolation faults, said system comprising:
   a fuel cell stack including a positive terminal and a negative terminal;
   a battery including a positive terminal and a negative terminal;
   a system bus including a positive rail electrically coupled to the positive terminals of the fuel cell stack and the battery and a negative rail electrically coupled to the negative terminals of the fuel cell stack and the battery, wherein system loads are electrically coupled in parallel to the positive rail and the negative rail; and
   a ground rail and a plurality of comparators, wherein a plurality of isolation resistances are defined in the system, and wherein the system measures a plurality of voltage potentials in the system relative to the isolation resistances and compares the measured voltage potentials to predetermined voltage potentials by one or more of the comparators to determine whether any of the isolation resistances have fallen below a predetermined minimum value where an output of one or more of the comparators identifies whether an isolation fault has occurred.

2. The system according to claim 1 wherein the plurality of isolation resistances include seven isolation resistances.

3. The system according to claim 2 wherein the seven isolation resistances include a first isolation resistance internal to the fuel cell stack, a second isolation resistance between the positive terminal of the stack and the ground rail, a third isolation resistance between the negative terminal of the stack and the ground rail, a fourth isolation resistance between the positive rail and the ground rail, a fifth isolation resistance between the negative rail and the ground rail, a sixth isolation resistance between the positive terminal of the battery and the ground rail and a seventh isolation resistance between the negative terminal of the battery and the ground rail.

4. The system according to claim 1 wherein the system determines an isolation fault for four separate cases.

5. The system according to claim 1 wherein the measured voltage potentials include a stack voltage potential of the fuel cell stack, a positive fuel cell voltage potential between the positive rail and the ground rail, a negative fuel cell voltage potential between the negative rail and the ground rail, a positive battery voltage potential between the positive battery terminal and the ground rail and an overall battery voltage potential.

6. The system according to claim 5 wherein an isolation fault has occurred if the positive battery voltage potential falls below the overall battery voltage potential minus the stack voltage potential plus a predetermined threshold voltage potential value.

7. The system according to claim 5 wherein an isolation fault has occurred if the positive battery voltage potential falls below a predetermined threshold voltage potential.

8. The system according to claim 5 wherein an isolation fault has occurred if the positive fuel cell voltage potential is greater than the stack voltage potential minus a predetermined threshold voltage potential.

9. The system according to claim 5 wherein an isolation fault has occurred if the absolute value of the positive fuel cell voltage potential plus the negative fuel cell voltage potential falls below a predetermined threshold voltage potential.

10. The system according to claim 1 wherein the system is part of a fuel cell hybrid vehicle.

11. A system for detecting isolation faults in a fuel cell hybrid vehicle, said system comprising:
a fuel cell stack including a positive terminal and a negative terminal;
a battery including a positive terminal and a negative terminal;
a system bus including a positive rail electrically coupled to the positive terminals of the fuel cell stack and the battery and a negative rail electrically coupled to the negative terminals on the fuel cell stack and the battery, wherein system loads are electrically coupled in parallel to the positive rail and the negative rail; and
a ground rail and a plurality of comparators, wherein a first isolation resistance is defined internal to the fuel cell stack, a second isolation resistance is defined between the positive terminal of the stack and the ground rail, a third isolation resistance is defined between the negative terminal of the stack and the ground rail, a fourth isolation resistance is defined between the positive rail and the ground rail, a fifth isolation resistance is defined between the negative rail and the ground rail, a sixth isolation resistance is defined between the positive terminal of the battery and the ground rail and a seventh isolation resistance is defined between the negative terminal of the battery and the ground rail, and wherein the system measures a fuel cell stack voltage potential, a positive fuel cell voltage potential between the positive rail and the ground rail, a negative fuel cell voltage potential between the negative rail and the ground rail, a positive battery terminal voltage potential between the positive battery terminal and the ground rail, and an overall battery voltage potential between the positive and negative battery terminals, and wherein the system uses the measured voltage potentials to determine if any of the isolation resistances have fallen below a predetermined minimum value by comparing the measured voltage potentials to predetermined voltage potentials by one or more of the comparators.

12. The system according to claim 11 wherein the system determines an isolation fault for four separate cases.

13. The system according to claim 11 wherein an isolation fault has occurred if the positive battery voltage potential falls below the overall battery voltage potential minus the stack voltage potential plus a predetermined threshold voltage potential value.

14. The system according to claim 11 wherein an isolation fault has occurred if the positive battery voltage potential falls below a predetermined threshold voltage potential.

15. The system according to claim 11 wherein an isolation fault has occurred if the positive fuel cell voltage potential is greater than the stack voltage potential minus a predetermined threshold voltage potential.

16. The system according to claim 11 wherein an isolation fault has occurred if the absolute value of the positive fuel cell voltage potential plus the negative fuel cell voltage potential falls below a predetermined threshold voltage potential.

17. A method for detecting isolation faults in a fuel cell system, said method comprising:
providing a fuel cell stack including a positive terminal and a negative terminal;
providing a battery including a positive terminal and a negative terminal;
providing a system bus including a positive rail electrically coupled to the positive terminals of the fuel cell stack and the battery and a negative rail electrically coupled to the negative terminals of the fuel cell stack and the battery, wherein system loads are electrically coupled in parallel to the positive rail and the negative rail;
providing a ground rail;
defining a plurality of isolation resistances in the system;
measuring a plurality of voltage potentials in the system relative to the isolation resistances;
comparing the measured voltage potentials to predetermined voltage potentials to determine whether any of the isolation resistances have fallen below a predetermined minimum value; and
determining that an isolation fault has occurred based on the comparison.

18. The method according to claim 17 wherein measuring a plurality of voltage potentials includes measuring a stack voltage potential of the fuel cell stack, measuring a positive fuel cell voltage potential between the positive rail and the ground rail, measuring a negative fuel cell voltage potential between the negative rail and the ground rail, measuring a positive battery voltage potential between the positive battery terminal and the ground rail, and measuring an overall battery voltage potential.

19. The method according to claim 18 wherein determining that an isolation fault has occurred based on the comparison includes determining that an isolation fault has occurred if the positive battery voltage potential falls below the overall battery voltage potential minus the stack voltage potential plus a predetermined threshold voltage potential value, determining that an isolation fault has occurred if the positive battery voltage potential falls below a predetermined threshold voltage potential, determining that an isolation fault has occurred if the positive fuel cell voltage potential is greater than the stack voltage potential minus a predetermined threshold voltage potential, and determining that an isolation fault has occurred if the absolute value of the positive fuel cell voltage potential plus the negative fuel cell voltage potential falls below a predetermined threshold voltage potential.

20. The method according to claim 17 wherein defining a plurality of isolation resistances in the system includes defining a first isolation resistance internal to the fuel cell stack, defining a second isolation resistance between the positive terminal of the stack and the ground rail, defining a third isolation resistance between the negative terminal of the stack and the ground rail, defining a fourth isolation resistance between the positive rail and the ground rail, defining a fifth isolation resistance between the negative rail and the ground rail, defining a sixth isolation resistance between the positive terminal of the battery and the ground rail and defining a seventh isolation resistance between the negative terminal of the battery and the ground rail.

* * * * *